United States Patent
Lützow et al.

(10) Patent No.: US 11,963,308 B2
(45) Date of Patent: Apr. 16, 2024

(54) METHOD FOR INCREASING ADHESION STRENGTH BETWEEN A SURFACE OF COPPER OR COPPER ALLOY AND AN ORGANIC LAYER

(71) Applicant: Atotech Deutschland GmbH, Berlin (DE)

(72) Inventors: Norbert Lützow, Berlin (DE); Wonjin Cho, Berlin (DE); Toshio Honda, Berlin (DE); Dirk Tews, Berlin (DE); Markku Lager, Berlin (DE); Felix Tang, Berlin (DE); Mirko Kloppisch, Berlin (DE); Aaron Hahn, Berlin (DE); Gabriela Schmidt, Berlin (DE); Martin Thoms, Berlin (DE)

(73) Assignee: Atotech Deutschland Gmbh & Co. KG, Berlin (DE)

( * ) Notice: Subject to any disclaimer, the term of this patent is extended or adjusted under 35 U.S.C. 154(b) by 662 days.

(21) Appl. No.: 17/052,545

(22) PCT Filed: May 6, 2019

(86) PCT No.: PCT/EP2019/061526
§ 371 (c)(1),
(2) Date: Nov. 3, 2020

(87) PCT Pub. No.: WO2019/215072
PCT Pub. Date: Nov. 14, 2019

(65) Prior Publication Data
US 2021/0251085 A1    Aug. 12, 2021

(30) Foreign Application Priority Data
May 8, 2018   (EP) .................... 18171175

(51) Int. Cl.
*H05K 3/38*     (2006.01)
*C23C 22/52*   (2006.01)
*C23G 1/10*    (2006.01)

(52) U.S. Cl.
CPC ............ *H05K 3/385* (2013.01); *C23C 22/52* (2013.01); *C23G 1/103* (2013.01); *H05K 2203/124* (2013.01)

(58) Field of Classification Search
CPC .. H05K 3/385; H05K 2203/124; H05K 3/389; H05K 3/282; C23C 22/52; C23G 1/103; B32B 15/08; B32B 15/20; B32B 37/0038
See application file for complete search history.

(56) References Cited

U.S. PATENT DOCUMENTS

| | | | |
|---|---|---|---|
| 6,106,899 A | 8/2000 | Nakagawa et al. | |
| 6,733,886 B2 | 5/2004 | Kawaguchi et al. | |
| 8,945,298 B2 | 2/2015 | Sparing et al. | |
| 9,763,336 B2 | 9/2017 | Wei et al. | |
| 2002/0192460 A1* | 12/2002 | Kawaguchi | C23F 1/18 427/407.1 |
| 2004/0099343 A1 | 5/2004 | Ferrier | |
| 2010/0323099 A1 | 12/2010 | Sparing et al. | |
| 2014/0141169 A1 | 5/2014 | Huelsmann et al. | |
| 2016/0360623 A1* | 12/2016 | Wei | C23C 8/40 |
| 2020/0040460 A1* | 2/2020 | Akiyama | H05K 3/26 |

FOREIGN PATENT DOCUMENTS

| | | |
|---|---|---|
| CN | 101407699 A | 4/2009 |
| JP | 2004119564 A | 4/2004 |
| JP | 2009299096 A | 12/2009 |
| KR | 1020100077814 A | 7/2010 |
| WO | 2009109391 A1 | 9/2009 |
| WO | 2012005722 A1 | 1/2012 |
| WO | 2017018232 A1 | 2/2017 |
| WO | 2017056534 A1 | 4/2017 |

OTHER PUBLICATIONS

Office Action for corresponding Japanese Application No. 2020-558589 dated Feb. 20, 2023.
PCT/EP2019/061526; PCT International Search Report and Written Opinion of the International Searching Authority dated May 29, 2019.

* cited by examiner

*Primary Examiner* — Ricardo D Morales
(74) *Attorney, Agent, or Firm* — Renner, Otto, Boisselle & Sklar, LLP

(57) ABSTRACT

The present invention relates to a method for increasing adhesion strength between a surface of copper or copper alloy and an organic layer, the method comprising in this order the steps:

(i) providing a non-conductive substrate comprising on at least one side said surface, said surface having a total surface area of copper or copper alloy, (ii) contacting said substrate comprising said surface with an acidic aqueous non-etching protector solution comprising
  (ii-a) one or more than one amino azole,
  (ii-b) one or more than one organic acid and/or salts thereof,
  (ii-c) one or more than one peroxide in a total amount of 0.4 wt-% or less, based on the total weight of the protector solution, and
  (ii-d) inorganic acids in a total amount of 0 to 0.01 wt-%, based on the total weight of the protector solution, wherein during step (ii) the total surface area of said surface is not increased upon contacting with the protector solution.

20 Claims, No Drawings

METHOD FOR INCREASING ADHESION STRENGTH BETWEEN A SURFACE OF COPPER OR COPPER ALLOY AND AN ORGANIC LAYER

The present application is a U.S. National Stage Application based on and claiming benefit and priority under 35 U.S.C. § 371 of International Application No. PCT/EP2019/061526, filed 6 May 2019, which in turn claims benefit of and priority to European Application No. 18171175.5 filed 8 May 2018, the entirety of both of which is hereby incorporated herein by reference.

FIELD OF THE INVENTION

The present invention generally relates to a method for manufacturing a printed circuit board (PCB), in particular to a method for increasing adhesion strength between a surface of copper or copper alloy and an organic layer, such as a solder mask or a build-up layer, preferably a build-up layer, most preferably a build-up layer in a multi-layer PCB. The present invention furthermore relates to an acidic aqueous non-etching protector solution.

BACKGROUND OF THE INVENTION

A PCB is a thin board for mounting electrical parts on at least one of its surfaces, such as integrated circuits (ICs), resistors, switches, and the like, in order to obtain a printed circuit board assembly (PCBA). During the manufacturing process of a PCB typically a copper circuitry is formed on a non-conductive substrate/layer, which is typically made of an epoxy resin or a polyimide resin. The most common non-conductive substrate/layer is a glass-reinforced epoxy laminate, commercially known as FR-4.

In order to obtain a multi-layer PCB, typically a stack of non-conductive substrates/layers with its conductive copper circuitries is formed to obtain a one piece product.

Typically, during PCB manufacturing (in particular during manufacturing a multi-layer PCB) two particular types of non-conductive substrates/layers are utilized, which are permanent: (i) the aforementioned non-conductive substrates/layers called build-up layers (also called pre-pregs, inner layers, insulating layers, etc.) forming within a multi-layer PCB the non-conductive substrates/layers between circuitries and (ii) solder masks (also often referred to as solder resists, outer layers etc.) covering and protecting the exposed outer most circuitry in multi-layer and non-multi-layer PCBs.

A solder mask is, after its polymerization (also called curing or hardening), a fully polymerized, permanent layer of non-conductive material which covers the surface of the outer most non-conductive substrate/layer and most of its copper circuitry. A solder mask is patterned to fully cover the circuitry, except for those portions of the copper circuitry intended to be exposed for soldering. In such areas the solder mask typically exhibits openings, such as pad openings.

A multi-layer PCB is formed by alternately stacking build-up layers and copper circuitries. The build-up layers electrically insulate the copper circuitries from one another and furthermore provide stability. However, vias are formed at well-defined positions, electrically connecting a circuitry of one layer with one or more than one circuitries of other layers. Such vias are formed for example by use of a laser, plasma, photo methods or conventional drilling.

Usually, a build-up layer is vacuum laminated onto a respective non-conductive substrate/layer or a core-substrate and covers the copper circuitry of said substrate/layer and core-substrate, respectively. The build-up layer (or a plurality of build-up layers) is subsequently pressed and/or subjected to a first thermal treating step to obtain a sufficiently pre-polymerized build-up layer. A temperature in the range from 170° C. to 200° C. is usually applied for approximately 30 minutes.

Subsequent to that first thermal treating step, the pre-polymerized build-up layer is in a condition for patterning, in particular for via formation. Afterwards, the surface of the build-up layer and the via surfaces are usually desmeared and basically in condition for forming the next copper circuitry in the multi-layer PCB.

The process of forming the next copper circuitry is carried out, for example, by means of (i) a subtractive process usually starting by laminating a copper foil, (ii) a semi-additive process (SAP) or advanced modified semi-additive process (AMSAP) typically starting with an electrolessly deposited copper layer, or (iii) a full-additive process (FAP) starting with forming a temporarily, structured photo resist layer for selectively depositing copper. Of these processes, the SAP is typically applied, in particular for manufacturing high density PCBs.

In the SAP, a copper layer is electrolessly deposited onto the build-up layer surface prior to a second thermal treating step usually carried out at a temperature in the range from 100° C. to 150° C. for at least 30 minutes (also often referred to as drying step). In this thermal treating step heat is applied to a pre-polymerized, copper plated build-up layer.

In a next step, a temporary, photo sensitive layer of non-conductive material (photo resist layer) is formed onto the layer of electrolessly deposited copper, subsequently patterned to form openings, and cured. Afterwards, additional copper is deposited into the openings.

In a last step, the temporary, photo sensitive layer and residual copper layer are removed. As a result, the copper circuitry of the next layer is formed, which next is to be prepared for the lamination of the next build-up layer.

It is essential that no delamination occurs during the life time of such a multi-layer PCB. Therefore, it is desired that the adhesion between a copper circuitry and a build-up layer laminated thereon is as high as possible and remains strong during the life time of the respective PCB.

However, build-up layers sometimes suffer the disadvantage that insufficient adhesion is obtained, which results in delamination at the interface between copper circuitry and build-up layer.

In order to obtain a strong adhesion, various preparation methods for a surface of a copper circuitry are known.

A conventional method is to form a layer of so called "black oxide" on the copper surface by contacting the copper surface with a high-temperature, strong alkaline aqueous solution. Such a layer typically extends to a layer thickness of approximately 1000 nm or more. In many cases, the obtained adhesion is by far not sufficient. Furthermore, in many cases this method is inadequate for fine line circuitries.

Another method is to apply a strong etchant, which leaves behind a strongly roughened copper surface (see for example JP 2740768), usually known as a micro-roughened copper surface. Such a treatment typically removes copper harshly from the circuitries' surface leaving behind a strongly roughened copper surface, including broad and deep cavities, even in the micrometer range. As a result, such a method is also less suitable for fine line circuitries, in particular high frequency applications, because the loss of copper is too dramatic, the surface becomes too rough, and the obtained adhesion is often too weak.

Other approaches utilize various chemical modifications of the copper surface to increase said adhesion.

US 2002/0192460 A1 discloses a coating film of an azole-copper complex compound to provide a laminate with improved adhesion between a surface of copper/copper alloy and resin in a multilayered printed circuit board, and also a method of manufacturing the laminate.

WO 2009/109391 A1 relates to a non-etching non-resist adhesion composition for the treatment of copper or copper alloys and to a method of preparing a work piece having a copper or copper alloy surface for subsequent coating the copper or copper alloy surface with a polymeric deposit, using the non-etching non-resist adhesion composition.

WO 2012/005722 A1 discloses in claim 1 a "method of treating a metal surface to promote adhesion between the metal surface and an organic material characterized in that: a metal oxide layer is formed on the metal surface, and formation of the metal oxide layer is controlled by a self-limiting reaction between the metal oxide and a surface modifier compound". This reaction includes after formation of the metal oxide layer a subsequent reduction of the metal oxide layer to obtain a nano-roughened surface layer, exhibiting a layer thickness of typically not more than 500 nm. This is considerably smoother compared for example to a micro-roughened surface as mentioned above. This process requires that after the reducing the nano-roughened surface layer is protected from re-oxidation (e.g. by oxygen in the surrounding air).

Due to further miniaturization, it is generally demanded to further improve existing methods such that adhesion strength is further increased.

OBJECTIVE OF THE PRESENT INVENTION

It was therefore the objective of the present invention to provide an improved method for increasing adhesion strength between a surface of copper or copper alloy and an organic layer such that adhesion strength is further increased compared to prior art methods.

It is in particular the objective to provide a more reliable method with further increased adhesion strength of a copper circuitry of a printed circuit board to an organic layer.

DESCRIPTION OF THE INVENTION

The aforementioned objectives are solved by a method for increasing adhesion strength between a surface of copper or copper alloy and an organic layer, the method comprising in this order the steps:
(i) providing a non-conductive substrate comprising on at least one side said surface, said surface having a total surface area of copper or copper alloy,
(ii) contacting said substrate comprising said surface with an acidic aqueous non-etching protector solution comprising
(ii-a) one or more than one amino azole,
(ii-b) one or more than one organic acid and/or salts thereof,
(ii-c) one or more than one peroxide in a total amount of 0.4 wt-% or less, based on the total weight of the protector solution, and
(ii-d) inorganic acids in a total amount of 0 to 0.01 wt-%, based on the total weight of the protector solution, wherein during step (ii) the total surface area of said surface is not increased upon contacting with the protector solution.

The objective is furthermore solved by means of an acidic aqueous non-etching protector solution comprising
(a) one or more than one amino azole,
(b) one or more than one organic acid and/or salts thereof,
(c) one or more than one peroxide in a total amount of 0.4 wt-% or less, based on the total weight of the protector solution, and
(d) inorganic acids in a total amount of 0 to 0.01 wt-%, based on the total weight of the protector solution,
wherein in the acidic aqueous non-etching protector solution the molar ratio of all peroxides to all amino azoles is 1 or less.

The method of the present invention and the protector solution of the present invention are for increasing adhesion strength between a surface of copper or copper alloy and an organic layer without etching or a noticeable removal of copper/copper alloy. This means that during step (ii) of the method of the present invention the total surface area of copper or copper alloy is not increased but rather remains constant. In other words, after step (ii) the total surface area of copper/copper alloy is substantially the same compared to the start of step (ii). This differentiates the method of the present invention over a number of known methods, in particular etching methods, which have the goal to increase the total surface area by roughening. Therefore, the method of the present invention is a non-etching method.

Preferred is a method of the present invention, wherein in step (i) the surface of copper or copper alloy comprises a copper or copper alloy circuitry, preferably is a copper or copper alloy circuitry. In such a case the surface of copper or copper alloy is structured. It preferably means that the non-conductive substrate simultaneously exposes on the same side non-conductive (preferably organic) areas as well as conductive copper/copper alloy areas. This is most preferred in the context of the method of the present invention.

Preferred is a method of the present invention, wherein in step (i) the copper or copper alloy circuitry comprises lines with a line width of 100 µm or less, preferably 75 µm or less, more preferably 55 µm or less. In some cases a method of the present invention is preferred, wherein in step (i) the copper or copper alloy circuitry comprises lines with a line width of 30 µm or less, preferably of 20 µm or less, most preferably of 10 µm or less.

The non-conductive substrate comprises on at least one side said copper or copper alloy surface as defined above (preferably as defined as being preferred). Preferably, said surface is pre-treated, more preferably by chemical conversion, most preferably by oxidation of copper into oxides and subsequent reduction of at least a part of these copper oxides. Thus, a method of the present invention is preferred, wherein in step (i) the surface of copper or copper alloy comprises a nano-roughened surface layer obtained by
  oxidizing Cu-(0) into Cu—(I) and Cu-(II), respectively, and subsequently
  reducing at least partly this Cu—(I) and Cu-(II), respectively, into Cu-(0).

As a result, a very preferred non-conductive substrate comprising on at least one side a surface of copper or copper alloy is obtained, the surface comprising a nano-roughened surface layer. Most preferred, such a surface of copper or copper alloy is structured, preferably comprises a circuitry, most preferably is a circuitry (for circuitry see details above).

The above mentioned nano-roughened surface layer is a layer of mainly copper (Cu-(0)) and residual amounts of copper oxides (including Cu—(I) and (Cu-(II)) on the surface of copper or copper alloy. This Cu-(0) and Cu—(I) needs to be protected from further undesired oxidation and/or re-oxidation. The nano-roughened surface layer typically has a needle-type morphology (also sometimes referred to as a "hairy surface morphology"), which results in a largely increased total surface area but without significantly roughening the surface (therefore called nano-roughened). Thus, preferred is a method of the present invention, wherein in step (i) or at the start of step (ii) the nano-roughened surface layer has a needle-type morphology. Most preferred, after step (ii) this needle-type morphology is still present. It is once more noted that during step (ii) of the method of the present invention this total surface area is not increased in a noticeable way.

Own experiments have shown that the method of the present invention (as defined throughout the present text) largely prevents said undesired oxidation and/or re-oxidation of the surface of copper or copper alloy, most preferably of the nano-roughened surface layer, by forming a protected surface of copper or copper alloy, most preferably by forming a protected nano-roughened surface layer, which results in increased adhesion strength to the organic layer, preferably a build-up layer. This is attributed to the utilization of the acidic aqueous non-etching protector solution as defined above and throughout the present text. In particular, the acidic aqueous non-etching protector solution does not measurably deteriorate the nano-roughened surface layer because upon contacting in step (ii) no noticeable etching occurs. As a result, during step (ii) no or essentially no copper is removed from the surface of copper or copper alloy; most preferably the nano-roughened surface layer is not removed during step (ii). This includes that the total surface area is not increased in a noticeable way. Thus, the method of the present invention is highly recommended for manufacturing multi-layer PCBs with fine line circuitries (i.e. line width of less than 30 μm) and PCBs for high frequency applications. Such applications are typically very susceptible to strong copper removal/etching.

Preferably, in the method of the present invention the substrate provided in step (i) exhibits already above described nano-roughened surface layer. However, in some cases a method of the present invention is preferred comprising in this order the steps:
  (i) providing a non-conductive substrate comprising on at least one side a surface of copper or copper alloy, the surface preferably comprising (most preferably being) a copper or copper alloy circuitry, said surface having a total surface area of copper or copper alloy,
  (ia) oxidizing Cu-(0) into Cu—(I) and Cu-(II), respectively, and subsequently
  (ib) reducing at least partly this Cu—(I) and Cu-(II), respectively, into Cu-(0), such that a surface of copper or copper alloy, the surface preferably comprising (most preferably being) a copper or copper alloy circuitry, comprising a nano-roughened surface layer results,
  (ii) contacting said substrate comprising said surface with an acidic aqueous non-etching protector solution comprising
    (ii-a) one or more than one amino azole,
    (ii-b) one or more than one organic acid and/or salts thereof,
    (ii-c) one or more than one peroxide in a total amount of 0.4 wt-% or less, based on the total weight of the protector solution, and
    (ii-d) inorganic acids in a total amount of 0 to 0.01 wt-%, based on the total weight of the protector solution,
  wherein during step (ii) the total surface area of said surface is not increased upon contacting with the protector solution and the nano-roughened surface layer is not removed.

The term "subsequently" denotes that step (ib) follows step (ia) basically immediately. However, in some cases it is preferred that a rinsing or conditioning step is included prior to step (ib).

Without wishing to be bound by theory it is assumed that in step (ia) copper atoms are chemically converted into oxides. Preferably, this conversion is self-limiting. After step (ia) the surface morphology is significantly modified and typically results in said needle type surface morphology with a very low surface roughness (nano-roughened) but a significantly increased total surface area (compared to the total surface area before step (ia)). Subsequently, these oxides are reduced by means of reduction, while the needle-type morphology is maintained. The obtained nano-roughened surface layer (as the result of this conversion) creates a basic adhesion strength between the surface of copper or copper alloy and the organic layer. This basic adhesion strength is preferably further increased by the method of the present invention.

Generally, the nano-roughened surface layer can be investigated, analyzed and measured by Atomic Force Microscopy (AFM), Fourier Transform Infrared Spectroscopy (FT-IR), Focused Ion Beam high resolution Scanning Electron Microscopy (FIB high resolution SEM), X-Ray Photoelectron Spectroscopy (XPS) and Transmission Electron Microscopy (TEM). Preferably, the analysis is carried out in vertical cross sections of respective samples. More preferably, the nano-roughened surface layer thickness is observed and determined by means of FIB high resolution SEM and AFM, e.g. to determine the maximum layer thickness. A very preferred method if AFM.

In step (ia), the oxidizing is preferably carried out by one or more than one oxidizing agent selected from the group consisting of chlorites, hypochlorites, peroxides, permanganates, perchlorates, persulphates, and ozone. A preferred chlorite is chlorous acid and alkaline chlorite, most preferably sodium chlorite. A preferred hypochlorite is hypochloric acid and salts thereof. A preferred peroxide is hydrogen peroxide. A preferred perchlorate is perchloric acid and salts thereof. Preferred persulfates are selected from the group consisting of peroxomonosulfates, peroxydisulfates and its related acids. Said oxidizing agents are present in a total concentration sufficient to accomplish the desired oxidation. After step (ia), copper is predominantly present in the oxidation number +2.

In step (ib), the reducing is preferably carried out by one or more than one reducing agent selected from the group consisting of organic reducing agents and inorganic reducing agents, preferably selected from the group consisting of aldehydes, borohydrides, borane, and substituted boranes. A preferred aldehyde is formaldehyde. After step (ib), copper is predominantly in the oxidation number 0 (Cu-(0)) although small amounts of copper in the oxidation number +1 are unavoidable due to immediate re-oxidation of Cu-(0). However, copper in the oxidation number 0 is preferred. During the reducing, the needle-type morphology is maintained.

In the method of the present invention, the nano-roughened surface layer is very smooth (in step (i) as well as in step (ii)) compared to conventional etching methods, which usually result in a very pronounced surface roughness or even surface destruction; usually including altering the surface topography. This is not desired, in particular not for fine line circuitries and high frequency applications. On the contrary, the preferred nano-roughened surface layer in step (i) of the method of the present invention very often does not exceed a thickness of 200 nanometers, is comparatively smooth due to the needle type morphology (i.e. nano-structured), and follows the contours of the surface of copper or copper alloy without altering its topography. Such a preferred nano-roughened surface layer (in step (i) as well as in step (ii)) is counted among so called non-etching adhesion promotors (NEAP). A method of the present invention is preferred, wherein in step (i) the nano-roughened surface layer has a maximum layer thickness of 500 nm or less, preferably 300 nm or less, more preferably 180 nm or less, even more preferably 150 nm or less, most preferably 120 nm or less.

If the maximum layer thickness significantly exceeds 500 nm, the roughness is in some cases too high and the method is then not suitable anymore for a number of fine line circuitry applications (e.g. line width below 30 µm). If the maximum layer thickness is for example significantly below 30 nm, the adhesion strength and peel strength is in some cases insufficient.

The preferred nano-roughened surface layer provides various advantages. PCBs used in high frequency applications benefit from comparatively smooth surfaces due to the decreased signal loss. Furthermore, only an insignificant amount of metallic copper forms said surface layer, leading to a decreased loss of metallic copper in the circuitry compared to conventional, harsh etching methods. In addition, an increased adhesion is obtained, which can be further increased by the method of the present invention.

In the method of the present invention the surface of copper or copper alloy is preferably a surface of copper, i.e. at least comprising 99 wt-% copper, based on the total weight of the surface of copper. In this case the surface of copper is preferably substantially free of, preferably does not comprise, other elements than copper; more preferably is substantially free of, preferably does not comprise, one, more than one or all elements selected from the group consisting of molybdenum, cobalt, nickel, tungsten, and titanium.

In the context of the present invention, the term "at least" in combination with a particular value denotes (and is exchangeable with) this value or more than this value. For example, "at least 99 wt-%" denotes (and is exchangeable with) "99 wt-% or more than 99 wt-%". Likewise, "at least one" denotes (and is exchangeable with) "one, two, three or more than three".

In contrast, in some cases the surface of copper alloy is preferred. A method of the present invention is preferred, wherein in step (i) the surface of copper alloy comprises at least 55 wt-% copper, based on the total weight of the surface of copper alloy, preferably at least 75 wt-%, more preferably at least 85 wt-%, most preferably at least 90 wt-%. Preferred alloying elements are selected from the group consisting of molybdenum, cobalt, nickel, tungsten, and titanium. In the context of the present invention, the term "copper alloy" does not include copper oxides.

In the context of the present invention, the term "substantially free" of a subject-matter (e.g. an element, a compound, a material, etc.) denotes that said subject-matter is not present at all or is present only in (to) a very little and non-disturbing amount (extent), without affecting the intended purpose of the invention. For example, such a subject-matter might be added or utilized unintentionally, e.g. as unavoidable impurity. "Substantially free" preferably denotes 0 (zero) ppm to 50 ppm, based on the total weight of the surface of copper or copper alloy defined in the method of the present invention, if defined for said surface, or based on the total weight of the protector solution defined in the method of the present invention, if defined for said solution; preferably 0 ppm to 25 ppm, more preferably 0 ppm to 10 ppm, even more preferably 0 ppm to 5 ppm, most preferably 0 ppm to 1 ppm. Zero ppm denotes that a respective subject-matter is not comprised. This principle likewise applies to the nano-roughened surface layer and organic layer.

The preferred nano-roughened surface layer properly treated with the acidic aqueous non-etching protector solution as defined above (preferably as defined throughout the present text) shows additionally improved adhesion strength between the surface of copper or copper alloy and the organic layer compared to a method (a) without utilizing the protector solution or (b) compared to a method utilizing a protector solution of different composition, in particular not comprising one or more than one peroxide or comprising one or more than one peroxide exceeding the total amount of 0.4 wt-%. It is assumed that the increased adhesion strength is attributed to a reduced re-oxidation of copper, in particular in subsequent treatment steps including increased temperatures. This is surprising because of the presence of minor amounts of said one or more than one peroxide with its etching potential.

Without wishing to be bound by theory it is assumed that in step (ii) the amino azole forms complexes with various copper species and adsorbs on the surface of copper or copper alloy. It is furthermore assumed that adsorbed complexes are formed on the surface of copper or copper alloy, thereby forming a thin protective film. Thus, a method of the present invention is preferred, wherein during step (ii) the one or more than one amino azole adsorbs on said surface of copper or copper alloy such that a protected surface of copper or copper alloy results, preferably adsorbs on said nano-roughened surface layer such that a protected nano-roughened surface layer results.

For the method of the present invention it is essential that upon contacting with the protector solution no etching occurs. This means that the surface of copper or copper alloy, preferably the nano-roughened surface layer, remains intact, i.e. is not removed and its total surface area is not increased. This is primarily achieved by avoiding too much peroxide, carefully maintaining a non-etching pH and avoiding strongly caustic inorganic acids. Furthermore, an amino azole is needed. In particular peroxides are known for their etching potential in etching solutions, in particular for etching copper. It was therefore surprising that the presence of peroxides further increases the adhesion strength between the surface of copper or copper alloy and the organic layer in a non-etching method for increasing adhesion strength.

Thus, in the context of the present invention (the method and the acidic aqueous non-etching protector solution) it is essential that the acidic aqueous non-etching protector solution comprises said one or more than one peroxide (preferably as described throughout the text as being preferred). The word "less" in the term "total amount of 0.4 wt-% or less" (as well as all other preferred total amounts) does not mean that said peroxides can be totally absent, i.e. less does not include zero wt-%. Therefore, the one or more than one peroxide is present in a total amount of more than 0 wt-%. Preferably, the total amount of said one or more than one peroxide is at least 0.01 wt-%, based on the total weight of the protector solution, more preferably at least 0.03 wt-%, even more preferably at least 0.05 wt-%, most preferably at least 0.07 wt-%.

In the context of the present invention, a peroxide is a compound comprising a peroxide moiety (—O—O—), wherein each oxygen atom has the oxidation number −1 (minus one). Preferred is a method of the present invention, wherein the one or more than one peroxide is selected from the group consisting of hydrogen peroxide, organic peroxides, and inorganic peroxides.

Preferred organic peroxides are selected from the group consisting of organic peroxy acids and non-acidic alkyl peroxides. A preferred organic peroxy acid is peracetic acid. A preferred non-acidic alkyl peroxide is tert-butyl hydroperoxide.

Preferred inorganic peroxides are selected from the group consisting of inorganic peroxy acids and metal peroxides. Preferred inorganic peroxy acids are peroxymonosulfuric acid and peroxydisulfuric acid. Preferred metal peroxides are alkali metal peroxides, more preferably sodium peroxide and potassium peroxydisulfate.

More preferred is a method of the present invention, wherein the one or more than one peroxide is selected from the group consisting of hydrogen peroxide and organic peroxides. In particular, in some cases a method of the present invention is preferred, wherein the acidic aqueous non-etching protector solution is substantially free of, preferably does not comprise, inorganic peroxy acids; in a more preferred case, is substantially free of, preferably does not comprise, inorganic peroxy acids and metal peroxides.

Most preferred is a method of the present invention, wherein the one or more than one peroxide comprises hydrogen peroxide, preferably is hydrogen peroxide. Most preferably, in the acidic aqueous non-etching protector solution hydrogen peroxide is the only peroxide compound. Hydrogen peroxide only consists of hydrogen and oxygen, and, thus, does not contaminate the working environment with additional compounds or elements. Furthermore, hydrogen peroxide sufficiently enhances adhesion strength by utilizing only little amounts in the acidic aqueous non-etching protector solution.

Preferred is a method of the present invention, wherein the total amount of the one or more than one peroxide is 0.35 wt-% or less, based on the total weight of the protector solution, preferably 0.30 wt-% or less, more preferably 0.25 wt-% or less, even more preferably 0.20 wt-% or less, most preferably 0.16 wt-% or less, even most preferably 0.12 wt % or less.

More preferred is a method of the present invention, wherein the one or more than one peroxide comprises hydrogen peroxide and the total amount of peroxides in the acidic aqueous non-etching protector solution is 0.35 wt-% or less, based on the total weight of the protector solution, preferably 0.30 wt-% or less, more preferably 0.25 wt-% or less, even more preferably 0.20 wt-% or less, most preferably 0.16 wt-% or less, even most preferably 0.12 wt-% or less. In such a case hydrogen peroxide is preferably the primary peroxide in terms of weight percent (>50 wt-%), based on the total weight of all peroxides in the acidic aqueous non-etching protector solution.

Most preferred is a method of the present invention, wherein in the acidic aqueous non-etching protector solution hydrogen peroxide is the only peroxide and the total amount of peroxides in the acidic aqueous non-etching protector solution is 0.35 wt-% or less, based on the total weight of the protector solution, preferably 0.30 wt-% or less, more preferably wt-% or less, even more preferably 0.20 wt-% or less, most preferably 0.16 wt-% or less, even most preferably 0.12 wt-% or less. In this case the total amount of peroxides equals the total amount of hydrogen peroxide.

In order to avoid undesired etching, the acidic aqueous non-etching protector solution does almost not contain inorganic acids, which are well known for their etching properties, in particular for etching copper. Their total amount is in the range of 0 to 0.01 wt-%, based on the total weight of the protector solution.

If the acidic aqueous non-etching protector solution comprises an inorganic acid additionally comprising a peroxide moiety (e.g. peroxymonosulfuric acid), in the context of the present invention such compounds are counted among (ii-c), i.e. are primarily considered as peroxides. Preferably, the acidic aqueous non-etching protector solution is substantially free of, preferably does not comprise, peroxymonosulfuric acid and peroxydisulfuric acid. More preferably, the acidic aqueous non-etching protector solution is substantially free of, preferably does not comprise, inorganic acids additionally comprising a peroxide moiety. This avoids unintended etching.

Preferred is a method of the present invention, wherein the acidic aqueous non-etching protector solution is substantially free of, preferably does not comprise, one, more than one or all of the following inorganic acids selected from the group consisting of sulfuric acid, nitric acid, hydrochloric acid, and phosphoric acid. In this case the aforementioned specific total amounts (in ppm) apply individually to each of the aforementioned inorganic acids, with the proviso that the total amount of all these acids together does not exceed wt-%, based on the total weight of the protector solution.

Very preferably, in the method of the present invention the non-etching protector solution is substantially free of, preferably does not comprise, sulfuric acid.

In particular preferred is a method of the present invention, wherein the acidic aqueous non-etching protector solution is substantially free of, preferably does not comprise inorganic acids. In this case the aforementioned specific total amounts (in ppm) apply to the sum of all inorganic acids. This applies to all inorganic acids excluding those comprising additionally a peroxide moiety.

It is also known that in etching solutions for copper typically halide ions are present, often in order to accelerate the copper etching. Thus, a method of the present invention is preferred, wherein the acidic aqueous non-etching protector solution is substantially free of, preferably does not comprise, chloride ions and fluoride ions, preferably is substantially free of, preferably does not comprise, halide ions at all. It is furthermore preferred that the acidic aqueous non-etching protector solution is substantially free of, preferably does not comprise, compounds containing fluorine atoms. This avoids undesired etching.

A method of the present invention is preferred, wherein the acidic aqueous non-etching protector solution is substantially free of, preferably does not comprise, phosphate ions, preferably is substantially free of, preferably does not comprise, compounds comprising a phosphate moiety, more preferably is substantially free of, preferably does not comprise, compounds containing phosphorous.

A method of the present invention is in some cases preferred, wherein the acidic aqueous non-etching protector solution is substantially free of, preferably does not comprise, polymers.

A method of the present invention is in some cases preferred, wherein the acidic aqueous non-etching protector solution is substantially free of, preferably does not comprise, compounds comprising quaternary nitrogen moieties.

A method of the present invention is in some cases preferred, wherein the acidic aqueous non-etching protector solution is substantially free of, preferably does not comprise, compounds comprising one or more than one sulfhydryl group.

The acidic aqueous non-etching protector solution as defined in step (ii) of the method of the present invention is acidic (i.e. a pH of 6.5 or less) and aqueous, i.e. water is the primary solvent, preferably water is the only solvent.

A method of the present invention is preferred, wherein the acidic aqueous non-etching protector solution has a pH in the range from 2.5 to 6, preferably in the range from 2.7 to more preferably in the range from 2.9 to 5.5, most preferably in the range from 3.1 to 4.9. If the pH is significantly below 2.5 undesired etching occurs, which is detrimental to the surface of copper or copper alloy. If the pH is significantly above 6 the adsorption of the amino azole is insufficient and the over-all performance of the acidic aqueous non-etching protector solution is unsatisfying. A very preferred pH range is from 4.1 to 4.9. In the context pf the present invention; pH is referenced to a temperature of 25° C.

In the method of the present invention, the one or more than one amino azole is an essential compound in the acidic aqueous non-etching protector solution (for the reasons outlined above). Own experiments suggest that a satisfying result is only obtained if said amino azole is utilized in the acidic aqueous non-etching protector solution.

In the context of the present invention, amino azole denotes a compound with a heterocyclic, five-membered aromatic ring, the compound additionally comprising at least one (preferably one) amino moiety (—NH 2), wherein the five-membered aromatic ring preferably comprises at least two nitrogen ring atoms as heteroatoms. Preferably, nitrogen atoms are the only hetero atoms within the aromatic ring.

A method of the present invention is preferred, wherein the one or more than one amino azole independently comprises at least three nitrogen ring atoms in the aromatic ring, more preferably at least four nitrogen ring atoms in the aromatic ring.

Preferred is a method of the present invention, wherein the at least one amino moiety (preferably one amino moiety) is directly connected with the aromatic ring via a covalent bond, preferably to a carbon ring atom of the aromatic ring.

In some cases a method of the present invention is preferred, wherein the aromatic ring is not an imidazole.

Preferred is a method of the present invention, wherein in each of the one or more than one amino azoles the five-membered aromatic ring is the only ring structure.

Preferred is a method of the present invention, wherein the one or more than one amino azole is selected from the group consisting of amino tetrazole, amino triazole, substituted amino triazole, and substituted amino tetrazole, preferably is selected from the group consisting of amino tetrazole and substituted amino tetrazole, most preferably the one or more than one amino azole comprises 5-amino tetrazole. Preferably, amino tetrazole also includes aminoalkyl tetrazole, such as 5-(aminomethyl)-tetrazole, although amino alkyl tetrazoles are less preferred compared to 5-amino tetrazole.

Preferably, in the acidic aqueous non-etching protector solution amino azoles are the only azole compounds. Own experiments indicate that amino azoles provide the optimal increase in adhesion strength in the method of the present invention.

In the substituted amino triazole and substituted amino tetrazole, preferred substituents are independently alkyl groups. A preferred alkyl group is a methyl group, an ethyl group and a propyl group. In some cases 1-propyl-5-amino tetrazole and 1-methyl-5-amino tetrazole are preferred substituted amino tetrazoles.

Preferred is a method of the present invention, wherein the one or more than one amino azole is present in a total amount of 2.0 wt-% or less, based on the total weight of the protector solution, preferably of 1.5 wt-% or less, more preferably of 1.0 wt-% or less, most preferably of 0.8 wt-% or less.

More preferred is a method of the present invention, wherein the one or more than one amino azole comprises 5-amino tetrazole and the total amount of amino azoles in the acidic aqueous non-etching protector solution is 2.0 wt-% or less, based on the total weight of the protector solution, preferably 1.5 wt-% or less, more preferably 1.0 wt-% or less, most preferably 0.8 wt-% or less. In such a case 5-amino tetrazole is preferably the primary amino azole in terms of weight percent (>50 wt-%), based on the total weight of all amino azoles in the acidic aqueous non-etching protector solution.

Most preferred is a method of the present invention, wherein in the acidic aqueous non-etching protector solution 5-amino tetrazole is the only amino azole and the total amount of amino azoles in the acidic aqueous non-etching protector solution is 2.0 wt-% or less, based on the total weight of the protector solution, preferably 1.5 wt-% or less, more preferably 1.0 wt-% or less, most preferably 0.8 wt-% or less. Even more preferred is a method of the present invention, wherein 5-amino azole is the only azole compound in the acidic aqueous non-etching protector solution and the total amount of azole compounds in the acidic aqueous non-etching protector solution is 2.0 wt-% or less, based on the total weight of the protector solution, preferably 1.5 wt-% or less, more preferably 1.0 wt-% or less, most preferably 0.8 wt-% or less.

Preferred is a method of the present invention, wherein in the acidic aqueous non-etching protector solution the molar ratio of all peroxides to all amino azoles is 1 or less, preferably is 0.8 or less, more preferably is 0.6 or less, even more preferably is 0.5 or less, most preferably is 0.4 or less. In order to avoid undesired etching, it is most desirable to have a molar ratio of not higher than 1:1, more preferably the molar concentration of all amino azoles is higher than the molar concentration of all peroxides.

In the method of the present invention, the acidic aqueous non-etching protector solution comprises one or more than one organic acid and/or salts thereof, preferably organic acids. Organic acids are primarily utilized for adjusting the pH of the acidic aqueous protector solution. This might be required because amino azole compounds are often dissolved in alkaline solutions for an increased solubility.

It is preferred that the acidic aqueous non-etching protector solution is substantially free of, preferably does not comprise, sulfonic acids. Typically, such acids are too strong and may cause undesired etching.

Preferably, each of the one or more than one organic acids has a positive $pK_a$ value, preferably a $pK_a$ value of 3.0 or higher, preferably of 3.3 or higher, more preferably in the range from 3.3 to 6.5. These $pK_a$ values are based on a temperature of 22° C.

Preferred is a method of the present invention, wherein the one or more than one organic acid and salts thereof are selected from the group consisting of mono-carboxylic acids, hydroxy-mono-carboxylic acids, di-carboxylic acids, hydroxy-di-carboxylic acids, tri-carboxylic acids, hydroxy-tri-carboxylic acids, amino carboxylic acids, and salts thereof; preferably selected from the group consisting of mono-carboxylic acids, hydroxy-mono-carboxylic acids, di-carboxylic acids, hydroxy-di-carboxylic acids, tri-carboxylic acids, hydroxy-tri-carboxylic acids, and salts thereof; most preferably selected from the group consisting of mono-carboxylic acids, hydroxy-mono-carboxylic acids, di-carboxylic acids, hydroxy-di-carboxylic acids, and salts thereof.

Particularly preferred specific organic acids and salts thereof are selected from the group consisting of formic acid, acetic acid, propionic acid, caprylic acid, glycolic acid, n-butyric acid, isobutyric acid, acrylic acid, crotonic acid, isocrotonic acid, oxalic acid, malonic acid, succinic acid, adipic acid, maleic acid, acetylenedicarboxylic acid, lactic acid, glyceric acid, tartaric acid, malic acid, citric acid, threonine, tryptophane, phenylalanine, and salts thereof.

Most preferred is a method of the present invention, wherein the one or more than one organic acid and salts thereof are selected from the group consisting of formic acid, acetic acid, lactic acid, malic acid, citric acid, and salts thereof, most preferably formic acid, acetic acid, and salts thereof.

The one or more than one organic acid might be present as a salt. Therefore, the acidic aqueous non-etching protector solution preferably comprises metal cations. Preferred metal cations in the acidic aqueous non-etching protector solution are alkali metal cations and alkaline earth metal cations, preferably alkali metal cations, more preferably sodium cations and potassium cations. Most preferably, the one or more than one organic acid is present in its acidic form.

Preferred is a method of the present invention, wherein the total amount of organic acid residue anions of the one or more than one organic acid and salts thereof is 4 wt-% or less, based on the total weight of the protector solution, preferably is 3.2 wt-% or less, more preferably is 2.5 wt-% or less, even more preferably is 1.9 wt-% or less, most preferably is 1.5 wt-% or less. If the total amount is too low, the desired pH cannot be properly obtained. If the total amount is significantly exceeding 4 wt-%, in a few cases undesired etching is observed.

Preferably, the acidic aqueous non-etching protector solution utilized in the method of the present invention basically consists of water as solvent, (ii-a), (ii-b), (ii-c), (ii-d), and optionally as conducting cations alkali metal cations and/or alkaline earth metal cations. Further compounds are not necessarily needed in the acidic aqueous non-etching protector solution in order to sufficiently increase adhesion strength.

Based on this, it is mostly preferred that an acidic aqueous non-etching protector solution comprising a solvent, (ii-a), (ii-b), (ii-c), (ii-d), and optionally as conducting cations alkali metal cations and/or alkaline earth metal cations constitutes at least 99 wt-% of the total weight of all ingredients in the acidic aqueous non-etching protector solution.

In step (ii) of the method of the present invention the acidic aqueous non-etching protector solution is contacted with the substrate comprising said surface such that the adhesion strength is increased. Preferred is a method of the present invention, wherein in step (ii) the contacting is carried out for 5 seconds to 600 seconds, preferably for 10 seconds to 300 seconds, more preferably for 15 seconds to 150 seconds, even more preferably for 20 seconds to 90 seconds, most preferably for 25 seconds to 45 seconds. Although no etching is observed even at 600 seconds, significantly exceeding 600 seconds usually does not result in any benefit and is, from a commercial point of view, undesired. On the contrary, if the contacting is significantly below 5 seconds an increase in adhesion strength seems in some cases not present.

Preferred is a method of the present invention, wherein in step (ii) the contacting is carried out at a temperature in the range from 15° C. to 50° C., preferably in the range from 20° C. to more preferably in the range from 30° C. to 40° C.

The acidic aqueous non-etching protector solution utilized in the method of the present invention is preferably not for chemical and/or mechanical polishing, such as CMP. Thus, the method of the present invention is not a polishing method, preferably not a CMP method.

The acidic aqueous non-etching protector solution utilized in the method of the present invention does not comprise abrasive particles (sometimes also referred to as grinding particles). Typical abrasive particles are silicon dioxide particles and aluminium-containing particles. Therefore, in the method of the present invention, the acidic aqueous non-etching protector solution is a clear solution, i.e. without solid particles.

As a result of the method of the present invention adhesion strength between the surface of copper or copper alloy and the organic layer is increased. Preferred is a method of the present invention comprising the additional step (iii) laminating the organic layer onto the substrate obtained after step (ii) such that the surface of copper or copper alloy contacted with the acidic aqueous non-etching protector solution during step (ii) is in contact with the organic layer.

After step (iii) the organic layer is in direct contact with the surface of copper or copper alloy. Since said surface is modified according to the method of the present invention, the adhesion strength between the organic layer and said surface is increased. If the surface of copper or copper alloy comprises (preferably is) a copper or copper alloy circuitry, the organic layer preferably covers non-conductive areas of the non-conductive substrate as well as conductive copper/copper alloy areas.

Preferably, the laminating is carried out under vacuum and increased temperature, preferably at a temperature in the range from 50° C. to 140° C.

In a subsequent step, the laminated organic layer is preferably cured, i.e. subjected to a heat treatment with higher temperatures such that the organic layer is polymerized. Thus, preferred is a method of the present invention comprising after step (iii) the additional step (iv) subjecting the substrate with the organic layer obtained after step (iii) to a heat treatment with a temperature in the range from 142° C. to 220° C., preferably in the range from 145° C. to 210° C., more preferably in the range from 150° C. to 205° C., such that the organic layer is polymerized.

Preferably, the subjection in step (iv) is carried out for 20 minutes to 180 minutes, preferably for 20 minutes to 150 minutes.

The organic layer is preferably a permanent layer. The term "permanent" denotes that a removal of the organic layer is not intended during the method of the present invention or after it. The organic layer is not a temporary layer; rather it most preferably stays for the entire life time of the non-conductive substrate, preferably a PCB. However, the term does not exclude different temporary conditions of the organic layer, for example polymerized and non-polymerized.

Preferably, the non-conductive substrate treated in the method of the present invention is a precursor of a circuit board, preferably a precursor of a multi-layer printed circuit board. Such a preferred precursor of a circuit board is needed to finally form a printed circuit board. In this case, preferably, in a first cycle of the method of the present invention, the organic layer laminated in step (iii) is preferably a build-up layer, which forms the non-conductive substrate in step (i) of a subsequent second cycle of the method of the present invention.

Thus, a method of the present invention is preferred, wherein the organic layer in step (iii) is a build-up layer.

More preferred is a method of the present invention, wherein the organic layer in step (iii) is a copper layer free build-up layer, more preferably a metal layer free build-up layer. In order to form for step (i) of a subsequent second cycle the non-conductive substrate comprising on at least one side a surface of copper or copper alloy (preferably a circuitry, most preferably as defined as being preferred throughout the present text), the organic layer (preferably the copper layer free build-up layer, more preferably the metal layer free build-up layer) is subjected after step (iii) (most preferably after step (iv)) of the first cycle to a copper metallization process in order to form the respective surface of copper or copper alloy (preferably a circuitry, most preferably as defined as being preferred throughout the present text). Afterwards, preferably the nano-roughened surface layer is formed, preferably as defined throughout the present text. Such a sequence of cycles is typical for semi-additive processes and own experiments have shown that the method of the present invention is in particular beneficial for such a process. Therefore, the method of the present invention is preferably utilized in a semi-additive processes for manufacturing printed circuit boards.

The non-conductive substrate provided in step (i) of the method of the present invention is preferably a core-substrate or the organic layer laminated in step (iii) of a previous cycle of the method of the present invention. A core-substrate is preferably the basis and starting point for building up a multi-layer PCB. Preferred core-substrates comprise a glass-cloth reinforced fiber material with a surface of copper or copper alloy on at least one side (preferably a copper/copper alloy circuitry). Preferably, such a core-substrate additionally comprises one or more than one group of filler particles selected from the group consisting of $SiO_2$, $Al_2O_3$, $TiO_2$, $ZrO_2$. Such a core-substrate is not a build-up layer.

Preferably, in the method of the present invention in step (iii) the organic layer is substantially free of, preferably does not comprise, filler fibers, preferably is substantially free of, preferably does not comprise, glass fibers. Instead, a method of the present invention is preferred, wherein in step (iii) the organic layer comprises filler particles, preferably one or more than one filler particles selected from the group consisting of $SiO_2$, $Al_2O_3$, $TiO_2$, $ZrO_2$, most preferably $SiO_2$.

A method of the present invention is preferred, wherein in step (iii) the organic layer is a dry film or a liquid, preferably a dry film, most preferably a dry film build-up layer. The skilled person knows that a liquid organic layer in this context is not fully fluid but exhibits a certain viscosity typical in this technical field. In the same manner the skilled person knows that a dry film is not completely dry but rather contains a certain amount of a typical solvent.

A method of the present invention is preferred, wherein in step (iii) the organic layer has a layer thickness of 50 µm or less, preferably 33 µm or less, more preferably 21 µm or less, even more preferably 15 µm or less, most preferably 10 µm or less.

Own experiments have shown that organic layers, preferably build-up layers, exhibiting a layer thickness of 50 µm or less, in particular of 21 µm or less are highly susceptible towards oxygen permeation, in particular when subjected to increased temperatures. Such permeation is highly undesired because it leads to re-oxidation of copper. Therefore, the method of the present invention is in particular beneficial for very thin organic layers, in particular below 21 µm, in order to prevent undesired re-oxidation of copper into copper oxides.

Preferably, the organic layer comprises at least one compound selected from the group of compounds consisting of epoxy compounds, polyimides, cyanate esters, bismaleimide-triazine compounds, polypropylene ethers, and polyolefins. A method of the present invention is preferred, wherein in step (iii) the organic layer comprises epoxy compounds, more preferably the organic layer is a build-up layer comprising epoxy compounds.

The present invention also relates to an acidic aqueous non-etching protector solution comprising
(a) one or more than one amino azole,
(b) one or more than one organic acid and/or salts thereof,
(c) one or more than one peroxide in a total amount of 0.4 wt-% or less, based on the total weight of the protector solution, and
(d) inorganic acids in a total amount of 0 to 0.01 wt-%, based on the total weight of the protector solution,
wherein in the acidic aqueous non-etching protector solution the molar ratio of all peroxides to all amino azoles is 1 or less, preferably is 0.8 or less, more preferably is or less, even more preferably is 0.5 or less, most preferably is 0.4 or less.

Preferred is an acidic aqueous non-etching protector solution of the present invention, wherein the molar concentration of all amino azoles is higher than the molar concentration of all peroxides.

The benefits of the protector solution are already described in the text above in connection with the method of the present invention. The aforementioned regarding the method of the present invention applies likewise to the acidic aqueous non-etching protector solution of the present invention.

The invention is further explained by the following non-limiting examples.

Examples

A. Sample Preparation
Step (i): Providing a Non-Conductive Substrate Comprising on at Least One Side a Surface of Copper or Copper Alloy:
Representing the method of the present invention copper foils (150 mm×75 mm×35 µm) were used.

In a first step, the surfaces of copper of all foils were etch-cleaned by using a sulfuric acid/$H_2O_2$ solution containing 180 ml/L SoftClean UC168, 200 ml/L CupraEtch Starter, 75 ml/L Hydrox (all products of Atotech), and 545 ml/L DI water, to obtain etch-cleaned copper foils. The etch-cleaning removed heavy oxides and other compounds, such as anti-tarnishes and/or surfactants. After the etch-cleaning the etch-cleaned copper foils were rinsed with cold water for approximately two minutes. As a result etch-cleaned and rinsed copper foils were obtained.

Subsequently, a nano-roughened surface layer was formed.

Next the etch-cleaned and rinsed copper foils obtained after the first step were chemically treated by an oxidation and subsequent reduction reaction.

In a second step, said foils were immersed for 30 seconds at 50° C. into a conditioning solution containing 15.5 ml/L NovaBond IT Stabilizer (Atotech). The conditioner stabilizes a copper surface in terms of pH and electrochemical potential. As a result, conditioned copper foils were obtained.

In a third step, the conditioned copper foils were treated in an oxidizing solution comprising 100 ml/L NovaBond IT 102 (Atotech) and 15.5 ml/L NovaBond IT Stabilizer (Atotech). The treatment was carried out at 70° C. for 6 minutes leading to a uniform and self-limiting conversion of Cu (0) into Cu (I)-oxides and Cu (II)-oxides, respectively, eventually forming a needle-type layer of converted copper with a maximum layer thickness of less than 180 nm. After the oxidation the oxidized copper foils were rinsed with cold water.

In a fourth step, the oxidized and rinsed copper foils were contacted with a reducing solution comprising 20 ml/L NovaBond IT Reducer (Atotech) and 5 ml/L NovaBond IT Stabilizer. The reducing was carried out at 35° C. for 5 minutes and reduced copper foils were obtained. The reducing converted the copper oxides primarily into Cu (0), thereby enhancing the stability of the needle-type layer of converted copper towards chemicals. During the reducing, the needle-type morphology was maintained. Subsequent to the reducing, the copper foils were rinsed with cold water for approximately two minutes. As a result, reduced and rinsed copper foils with a nano-roughened surface layer were obtained.

Step (ii): contacting said substrate comprising said surface with an acidic aqueous non-etching protector solution:

In a fifths step, the reduced and rinsed copper foils with the nano-roughened surface layer were subjected to different acidic aqueous non-etching protector solutions (PS) as summarized in Table 1.

TABLE 1 summary of protector solutions used

|  | PS1* | PS2 | PS3* |
|---|---|---|---|
| Acetic acid | — | 190 mmol/L (ca. 1.1 wt-%) | 190 mmol/L (ca. 1.1 wt-%) |
| Formic acid | 1 wt-% | — | — |
| Amino tetrazole | 0.1 wt-% | 82 mmol/L (ca. 0.7 wt-%) | 82 mmol/L (ca. 0.7 wt-%) |
| $H_2O_2$ | — | — | 29 mmol/L (ca. 0.1 wt-%) |
| pH | 2.3 | 4.6 | 4.6 |

*not according to the present invention; based on E.6 in Table 1 of U.S. 2002/0192460 A1
**not according to the present invention
*** according to the present invention In each case, the reduced and rinsed copper foil was immersed into the respective protector solution (PS) for 30 seconds and the temperature of the protector solutions was approximately 35° C. After the immersion, the copper foils were rinsed with cold water for approximately 30 seconds and subsequently dried at a temperature between 60° C. to 70° C. As a result, protected and rinsed copper foils were obtained. These copper foils were subsequently subjected to laminating an organic layer and further tested.

Step (iii): Laminating the Organic Layer onto the Substrate Obtained after Step (ii):

In a laminating step, various protected and rinsed copper foils obtained after the fifths step were laminated with the following commercially known build-up layers (i.e. organic layers): GX-T31 and GZ-41 (both products of Ajinomoto) designed for fine line circuitry applications.

Lamination was carried out under vacuum at approximately 100° C. under yellow light in a clean room with a room temperature in the range from 20° C. to 25° C. and with a relative humidity of 50% to 60% by using a vacuum laminator (Dynachem VA 7124-HP6). Each build-up layer has a layer thickness of 20 μm.

Step (iv): Subjecting the Substrate with the Organic Layer Obtained after Step (iii) to a Heat Treatment:

Each substrate obtained after step (iii) was subjected to a heat treatment for 60 minutes at 160° C. using a conventional hot air convection oven (Heraeus Oven UT 6200) to polymerize (i.e. to cure) the build-up layers.

B. Adhesion Strength Evaluation:

For each sample the adhesion strength (initial and HAST) was evaluated.

"initial" adhesion strength determined after step (iv) and prior to any other treatment "HAST" adhesion strength determined after HAST test (96 h, 130° C., 85% rh, HAST chamber: EHS-221M)

A summary of the results is given in Table 2.

TABLE 2 summary of adhesion strength (GX-T31 and GZ-41):

| | Adhesion strength [N/cm] | | | |
|---|---|---|---|---|
| | GX-T31 | | GZ-41 | |
| | "initial" | "HAST" | "initial" | "HAST" |
| PS1 | 12.2 | 7.8 | 6.3 | 1.3 |
| PS2 | 12.4 | 6.8 | 6.1 | 1.4 |
| PS3 | 12.7 | 10.8 | 8.3 | 2.6 |

The values in Table 2 show that PS3 provides significantly improved adhesion strength for "initial" and most importantly after "HAST".

It was surprising that the addition of a comparatively small amount of a strong oxidizing agent such as $H_2O_2$ into a non-etching protector solution, utilized in a non-etching adhesion promotor process, further improves adhesion strength to the organic layer, compared to known non-etching adhesion promotor processes (see US 2002/0192460 A1). In case of GZ-41, adhesion strength has been doubled compared to US'460 and almost doubled compared to a composition not comprising a small amount of the strong oxidizing agent. Although the increase in adhesion strength for GX-T31 is minor in case of "initial", a significant increase of almost 40% is observed after "HAST", compared to PS1, which corresponds to US'460.

Increased adhesion strength was also obtained with a protector solution similar to PS3 but with the only exception that the concentration of acetic acid was below 1 wt-% (data not shown).

In order to determine the adhesion strength of a sample, several strip-type fragments have been prepared from each sample. For that the respective copper foils were adhered to a rigid board (identical size as the copper foils) in such a way that the rigid board with the copper foil faced the build-up layer. As a result, copper foils with structurally enforced build-up layers were obtained.

Afterwards, each enforced copper foil was sliced into said strip-type fragments (10×100 mm, Milling Cutter, Walter Lemmen CCD).

The strip-type fragments were subjected to a peel force measuring machine (RoeII Zwick Z010) to individually evaluate the adhesion strength (angle: 90°, speed: 50 mm/min) based on the force needed to delaminate the copper foil from its respective structurally enforced build-up layer.

In an additional control experiment the etching behavior of PS3 was examined (data not shown). During immersion no weight loss was observed, showing that copper and the nano-roughened surface layer, respectively, was not removed but remained intact.

The invention claimed is:

1. A method for increasing adhesion strength between a surface of copper or copper alloy and an organic layer, the method comprising in this order the steps:
   (i) providing a non-conductive substrate comprising on at least one side said surface, said surface having a total surface area of copper or copper alloy,
   (ii) contacting said substrate comprising said surface with an acidic aqueous non-etching protector solution comprising
      (ii-a) one or more than one amino azole,
      (ii-b) one or more than one organic acid and/or salts thereof,
      (ii-c) one or more than one peroxide in a total amount of 0.4 wt-% or less, based on the total weight of the protector solution, and
      (ii-d) one or more than one inorganic acid in a total amount of 0 to 0.01 wt %, based on the total weight of the protector solution,
   wherein during step (ii) the total surface area of said surface is not increased upon contacting with the protector solution, and
   wherein the protector solution is substantially free of chloride and fluoride ions.

2. The method of claim 1, wherein in step (i) the surface of copper or copper alloy comprises a nano-roughened surface layer obtained by
   oxidizing Cu-(0) into Cu—(I) and Cu-(II), respectively, and subsequently
   reducing at least partly this Cu—(I) and Cu-(II), respectively, into Cu-(0).

3. The method of claim 2, wherein in step (i) the nano-roughened surface layer has a maximum layer thickness of 500 nm or less.

4. The method according to claim 1, wherein during step (ii) the one or more than one amino azole adsorbs on said surface of copper or copper alloy such that a protected surface of copper or copper alloy results.

5. The method according to claim 1, wherein in the acidic aqueous non-etching protector solution the molar ratio of all peroxides to all amino azoles is 1 or less.

6. The method according to claim 1, wherein the one or more than one peroxide comprises hydrogen peroxide.

7. The method according to claim 1, wherein the total amount of the one or more than one peroxide is 0.35 wt-% or less, based on the total weight of the protector solution.

8. The method according to claim 1, wherein the acidic aqueous non-etching protector solution has a pH in the range from 2.5 to 6.

9. The method according to claim 1, wherein the one or more than one amino azole is selected from the group consisting of amino tetrazole, amino triazole, substituted amino triazole, and substituted amino tetrazole.

10. The method according to claim 1, wherein the one or more than one amino azole is present in a total amount of 2.0 wt-% or less, based on the total weight of the protector solution.

11. The method according to claim 1, wherein the total amount of organic acid residue anions of the one or more than one organic acid and salts thereof is 4 wt-% or less, based on the total weight of the protector solution.

12. The method according to claim 1, wherein in step (ii) the contacting is carried out for 5 seconds to 600 seconds.

13. The method according to claim 1 further comprising the additional step
   (iii) laminating the organic layer onto the substrate obtained after step (ii) such that the surface of copper or copper alloy contacted with the acidic aqueous non-etching protector solution during step (ii) is in contact with the organic layer.

14. The method of claim 13, wherein the organic layer in step (iii) is a build-up layer.

15. An acidic aqueous non-etching protector solution comprising
   (a) one or more than one amino azole,
   (b) one or more than one organic acid and/or salts thereof,
   (c) one or more than one peroxide in a total amount of 0.4 wt-% or less, based on the total weight of the protector solution, and
   (d) inorganic acids in a total amount of 0 to 0.01 wt-%, based on the total weight of the protector solution,
      wherein in the acidic aqueous non-etching protector solution the molar ratio of all peroxides to all amino azoles is 1 or less, and
      wherein the protector solution is substantially free of chloride and fluoride ions.

16. The method according to claim 1, wherein, in the acidic aqueous non-etching protector solution, molar ratio of all peroxides to all amino azoles is 0.6 or less.

17. The method according to claim 1, wherein the total amount of the one or more than one peroxide is 0.20 wt-% or less, based on the total weight of the protector solution.

18. The method according to claim 1, wherein the one or more than one amino azole comprises 5-amino tetrazole.

19. The method according to claim 1, wherein the one or more than one amino azole is present in a total amount of 1.0 wt-% or less, based on the total weight of the protector solution.

20. The method of claim 1, wherein the protector solution is substantially free of halide ions.

* * * * *